United States Patent
Khlat et al.

(10) Patent No.: US 11,422,170 B2
(45) Date of Patent: Aug. 23, 2022

(54) DIGITAL CURRENT SENSING CIRCUIT AND RELATED APPARATUS

(71) Applicant: Qorvo US, Inc., Greensboro, NC (US)

(72) Inventors: Nadim Khlat, Cugnaux (FR); Philippe Gorisse, Brax (FR); Christopher Truong Ngo, Queen Creek, AZ (US)

(73) Assignee: Qorvo US, Inc., Greensboro, NC (US)

( * ) Notice: Subject to any disclaimer, the term of this patent is extended or adjusted under 35 U.S.C. 154(b) by 181 days.

(21) Appl. No.: 16/191,558

(22) Filed: Nov. 15, 2018

(65) Prior Publication Data
US 2020/0025808 A1   Jan. 23, 2020

Related U.S. Application Data

(60) Provisional application No. 62/699,818, filed on Jul. 18, 2018.

(51) Int. Cl.
| G01R 19/25 | (2006.01) |
| G01R 19/00 | (2006.01) |
| G01R 31/50 | (2020.01) |

(52) U.S. Cl.
CPC ......... G01R 19/25 (2013.01); G01R 19/0092 (2013.01); G01R 31/50 (2020.01)

(58) Field of Classification Search
CPC .... G01R 19/25; G01R 31/50; G01R 19/0092; G01R 19/16542; G01R 15/09; G01R 1/203; G01R 31/00; G01R 31/3644; G01R 31/3648; G01R 31/382; G01R 31/3842; H02J 7/0021; H02J 7/0029; H02J 7/00304; H02J 7/0031; H02J 7/0047

See application file for complete search history.

(56) References Cited

U.S. PATENT DOCUMENTS

| 6,507,171 | B2* | 1/2003 | Ruha | H01M 10/44 320/128 |
| 2012/0319878 | A1* | 12/2012 | Bogner | H03M 1/46 341/110 |
| 2015/0077040 | A1* | 3/2015 | Longdon | H02J 7/0072 320/107 |
| 2015/0137820 | A1* | 5/2015 | Mikuteit | G01R 15/09 324/426 |
| 2017/0063118 | A1* | 3/2017 | Kohout | H02J 7/0071 |

* cited by examiner

Primary Examiner — Lee E Rodak
(74) Attorney, Agent, or Firm — Withrow & Terranova, P.L.L.C.

(57) ABSTRACT

A digital current sensing circuit and related apparatus is provided. In one aspect, a digital current sensing circuit can be configured to estimate a battery current in a coupled circuit based on a voltage corresponding to the battery current. More specifically, the digital current sensing circuit generates an analog sense current proportional to the battery current based on the voltage and digitally processes the analog sense current to generate a battery current indication signal indicative of an estimation of the battery current. In another aspect, a number of digital current sensing circuits can be provided in an apparatus to concurrently estimate a number of battery currents in a number of circuits (e.g., charge pump circuits). As a result, it may be possible to test, debug, and/or fine-tune the apparatus based on the estimated battery currents for improved performance.

18 Claims, 6 Drawing Sheets

DIGITAL CURRENT SENSING CIRCUIT AND RELATED APPARATUS

RELATED APPLICATIONS

This application claims the benefit of U.S. Provisional Patent Application Ser. No. 62/699,818, filed on Jul. 18, 2018, the disclosure of which is incorporated herein by reference in its entirety.

FIELD OF THE DISCLOSURE

The technology of the disclosure relates generally to radio frequency (RF) power amplifier circuits.

BACKGROUND

Mobile communication devices have become increasingly common in current society for providing wireless communication services. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences. The redefined user experience requires higher data rates offered by wireless communication technologies, such as long-term evolution (LTE) and fifth-generation new radio (5G-NR). To help realize the higher data rates, a mobile communication device may employ sophisticated power amplifiers (PAs) to increase output power of radio frequency (RF) signals (e.g., maintaining sufficient energy per bit) communicated by the mobile communication device.

Envelope tracking (ET) is a power management technique that can improve efficiency levels of the PAs to help reduce power consumption and thermal dissipation in the mobile communication device. As such, the mobile communication device typically includes one or more ET circuits configured to operate in various ET scenarios, such as single-transmit (STX) ET and/or dual-transmit (DTX) ET. Further, the mobile communication device may employ a number of charge pump circuits to support the ET circuits operating in the various ET scenarios.

Notably, the charge pump circuits may operate based on a battery. Each of the charge pump circuits may include one or more switches that may be toggled between open and closed positions according to the various ET scenarios. When a switch is closed, it can draw a battery current from the battery. In some cases, it may be desirable to measure the battery current flowing through one or more switches in the charge pump circuits to help determine various operational parameters of the mobile communication device. For example, by measuring the battery currents in the switches, it may help detect/debug certain operational issues when the mobile communication device undergoes a factory test. Further, by measuring the battery currents in the switches, it may also help generate/capture various statistics in the field to help fine-tune the mobile communication device for optimal performance.

SUMMARY

Embodiments of the disclosure relate to a digital current sensing circuit and related apparatus. In one aspect, a digital current sensing circuit can be configured to estimate a battery current in a coupled circuit based on a voltage corresponding to the battery current. More specifically, the digital current sensing circuit generates an analog sense current proportional to the battery current based on the voltage and digitally processes the analog sense current to generate a battery current indication signal indicative of an estimation of the battery current. In another aspect, a number of digital current sensing circuits can be provided in an apparatus to concurrently estimate a number of battery currents in a number of circuits (e.g., charge pump circuits). As a result, it may be possible to test, debug, and/or fine-tune the apparatus based on the estimated battery currents for improved performance.

In one aspect, a digital current sensing circuit is provided. The digital current sensing circuit includes a voltage input configured to receive a voltage corresponding to a battery current in a coupled circuit. The digital current sensing circuit also includes an analog current sensing circuit configured to generate an analog sense current proportional to the battery current based on the voltage. The digital current sensing circuit also includes a sense current processing circuit. The sense current processing circuit is configured to estimate the battery current in the coupled circuit based on the analog sense current. The sense current processing circuit is also configured to generate a binary word representing the estimated battery current in the coupled circuit. The sense current processing circuit is also configured to generate a battery current indication signal indicative of an estimation of the battery current in the coupled circuit based on the binary word.

In another aspect, an apparatus is provided. The apparatus includes a first voltage circuit coupled to at least one amplifier circuit. The first voltage circuit includes a first tracker circuit configured to generate a first modulated voltage at a first output node based on a first supply voltage. The first voltage circuit also includes a first charge pump circuit configured to generate a first current at the first output node. The first voltage circuit also includes a first digital current sensing circuit. The first digital current sensing circuit includes a voltage input configured to receive a voltage corresponding to a battery current in the first charge pump circuit. The first digital current sensing circuit also includes an analog current sensing circuit configured to generate an analog sense current proportional to the battery current based on the voltage. The first digital current sensing circuit also includes a sense current processing circuit. The sense current processing circuit is configured to estimate the battery current in the first charge pump circuit based on the analog sense current. The sense current processing circuit is also configured to generate a binary word representing the estimated battery current in the first charge pump circuit. The sense current processing circuit is also configured to generate a battery current indication signal indicative of an estimation of the battery current in the first charge pump circuit based on the binary word. The apparatus also includes a second voltage circuit coupled to the at least one amplifier circuit. The second voltage circuit includes a second tracker circuit configured to generate a second modulated voltage at a second output node based on a second supply voltage. The second voltage circuit also includes a second charge pump circuit configured to generate a second current at the second output node. The apparatus also includes a third charge pump circuit configured to provide the first supply voltage and the second supply voltage to the first tracker circuit and the second tracker circuit, respectively.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 1A:
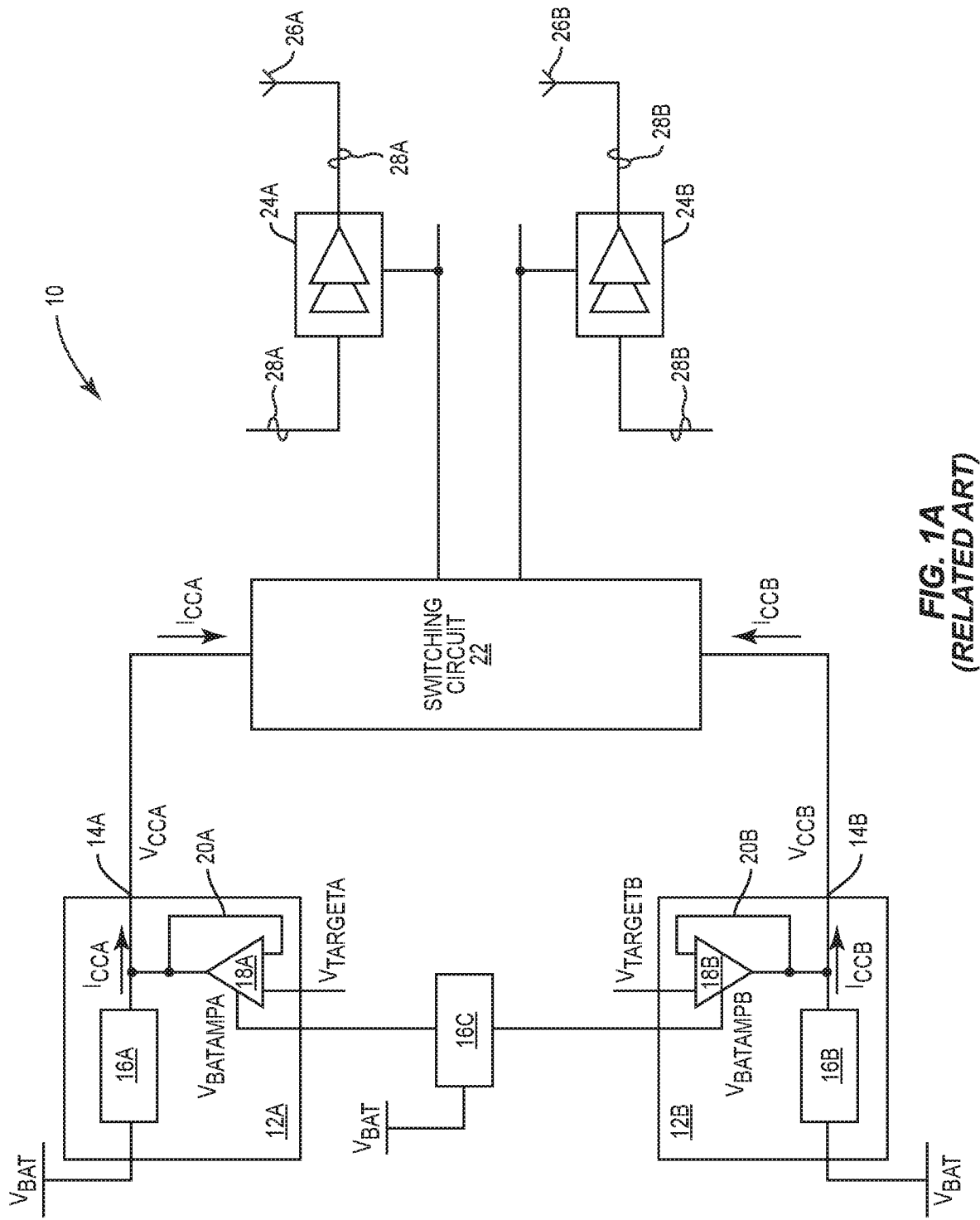
FIG. 1A is a schematic diagram of an exemplary existing apparatus.
Figure 4:
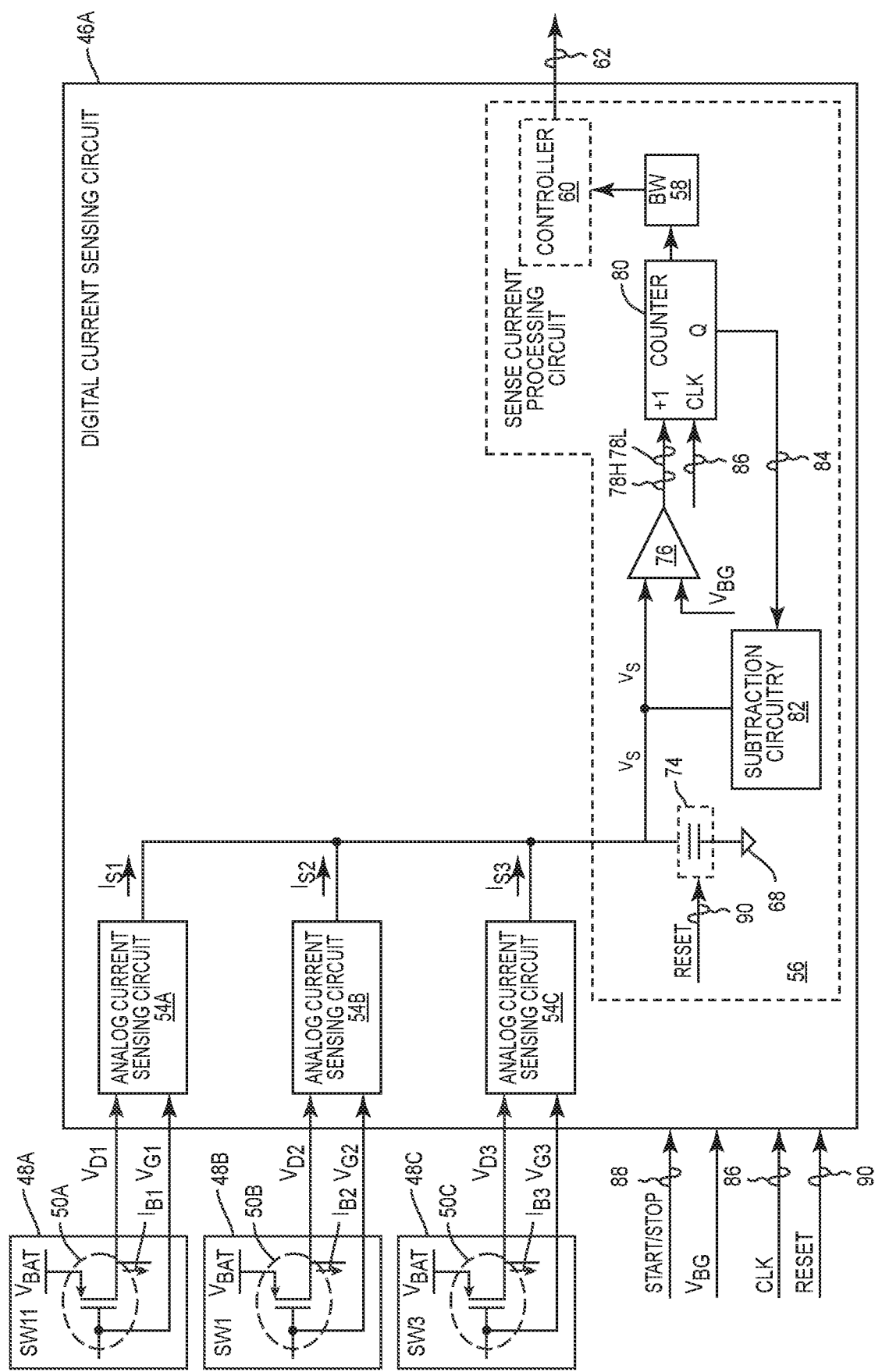
Figure 5:
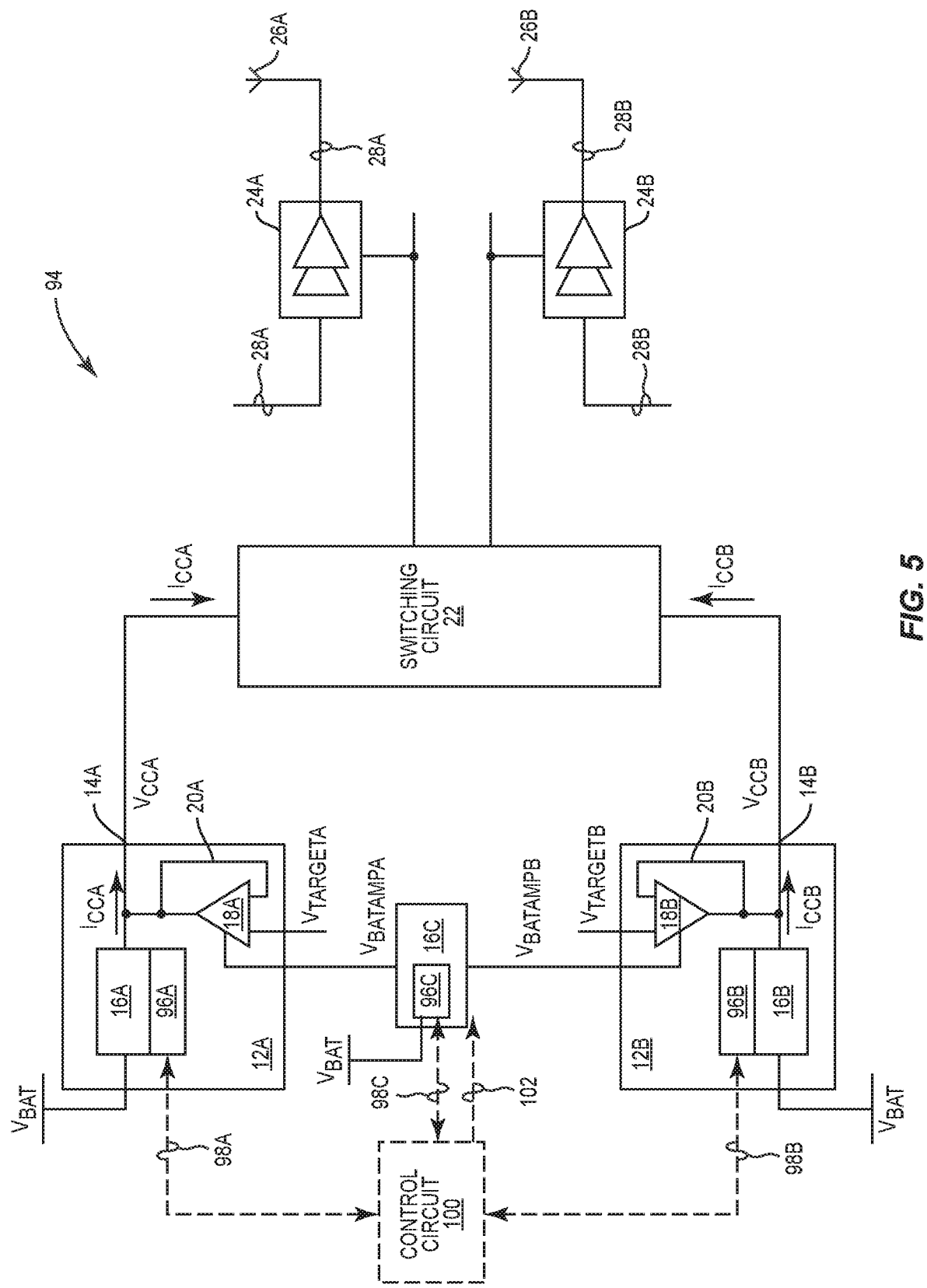

FIG. 4 is a schematic diagram of an exemplary digital current sensing circuit configured according to an embodiment of the present disclosure to estimate a number of battery currents in a number of coupled circuits; and FIG. 5 is a schematic diagram of an exemplary apparatus adapted from the existing apparatus of FIG. 1A to estimate a total battery current in a number of charge pump circuits by adding a number of the digital current sensing circuits, such as the digital current sensing circuit of FIG. 4, to the existing apparatus.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments of the disclosure relate to a digital current sensing circuit and related apparatus. In one aspect, a digital current sensing circuit can be configured to estimate a battery current in a coupled circuit based on a voltage corresponding to the battery current. More specifically, the digital current sensing circuit generates an analog sense current proportional to the battery current based on the voltage and digitally processes the analog sense current to generate a battery current indication signal indicative of an estimation of the battery current. In another aspect, a number of digital current sensing circuits can be provided in an apparatus to concurrently estimate a number of battery currents in a number of circuits (e.g., charge pump circuits). As a result, it may be possible to test, debug, and/or fine-tune the apparatus based on the estimated battery currents for improved performance.

Figure 1B:
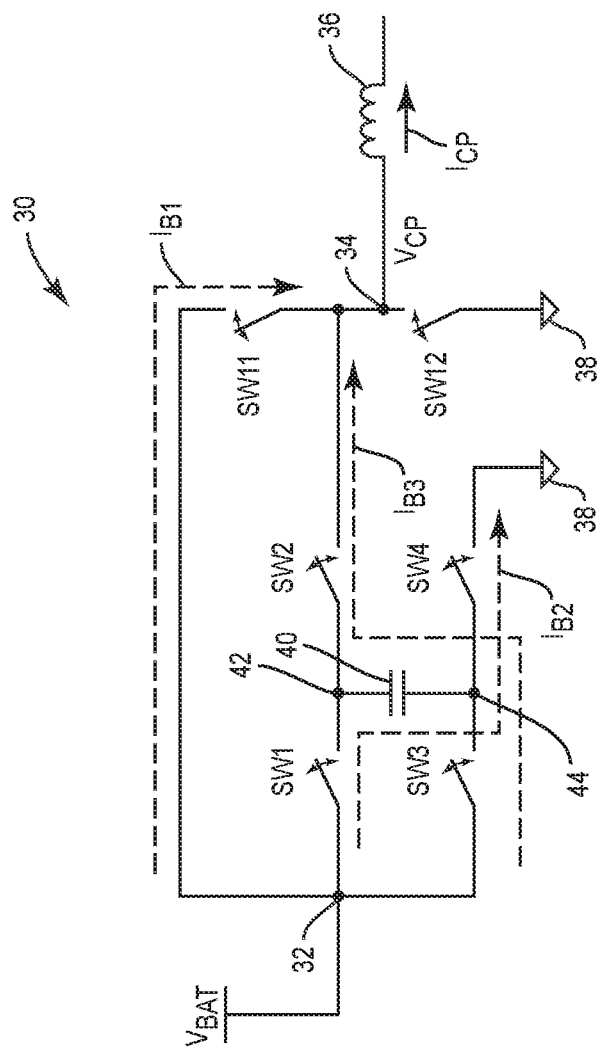
FIG. 1B is a schematic diagram of an exemplary charge pump circuit, which can be provided in the existing apparatus of FIG. 1A.

Before discussing a digital current sensing circuit and a related apparatus of the present disclosure, a brief overview of an existing apparatus consisting of a number of charge pump circuits is first provided with reference to FIGS. 1A and 1B to help understand the need and the difficulty to determine one or more battery currents in the charge pump circuits. The discussion of specific exemplary aspects of the digital current sensing circuit and related apparatus of the present disclosure starts below with reference to FIG. 2.

In this regard, FIG. 1A is a schematic diagram of an exemplary existing apparatus 10. The existing apparatus 10 includes a first voltage circuit 12A and a second voltage circuit 12B. The first voltage circuit 12A is configured to generate a first average power tracking (APT) voltage $V_{CCA}$ or a first envelope tracking (ET) voltage $V_{CCA}$ at a first output node 14A. The second voltage circuit 12B is configured to generate a second APT voltage $V_{CCB}$ or a second ET voltage $V_{CCB}$ at a second output node 14B.

The first voltage circuit 12A includes a first charge pump circuit 16A and a first tracker circuit 18A. The first charge pump circuit 16A receives a battery voltage $V_{BAT}$ and generates a first current $I_{CCA}$, which can be a direct current (DC) current, an alternate current (AC) current, or a combination of both, at the first output node 14A. The first tracker circuit 18A can also generate the first APT voltage $V_{CCA}$ at the first output node 14A. The first tracker circuit 18A is configured to generate the first ET voltage $V_{CCA}$ at the first output node 14A based on a first supply voltage $V_{BATAMPA}$. The first tracker circuit 18A receives a first time-variant target voltage $V_{TARGETA}$ and generates the first ET voltage $V_{CCA}$ that tracks the time-variant target voltage $V_{TARGETA}$. In this regard, the first ET voltage $V_{CCA}$ peaks when the first time-variant target voltage $V_{TARGETA}$ peaks and falls when the first time-variant target voltage $V_{TARGETA}$ falls. The first tracker circuit 18A may be coupled to a first feedback loop 20A, which provides a sample of the first ET voltage $V_{CCA}$ back to the first tracker circuit 18A.

The second voltage circuit 12B includes a second charge pump circuit 16B and a second tracker circuit 18B. The second charge pump circuit 16B receives the battery voltage $V_{BAT}$ and generates a second current $I_{CCB}$, which can be a DC current, an AC current, or a combination of both, at the second output node 14B. The second tracker circuit 18B can also generate the second APT voltage $V_{CCB}$ at the second output node 14B. The second tracker circuit 18B is configured to generate the second ET voltage $V_{CCB}$ at the second output node 14B based on a second supply voltage $V_{BATAMPB}$. The second tracker circuit 18B receives a second time-variant target voltage $V_{TARGETB}$ and generates the second ET voltage $V_{CCB}$ that tracks the second time-variant target voltage $V_{TARGETB}$. In this regard, the second ET voltage $V_{CCB}$ peaks when the second time-variant target voltage $V_{TARGETB}$ peaks and falls when the second time-variant target voltage $V_{TARGETB}$ falls. The second tracker circuit 18B may be coupled to a second feedback loop 20B, which provides a sample of the second ET voltage $V_{CCB}$ back to the second tracker circuit 18B.

The existing apparatus 10 includes a switching circuit 22. The switching circuit 22 is coupled to the first output node 14A and the second output node 14B. The switching circuit 22 includes one or more switches (not shown) that can be individually or concurrently controlled to provide the first current $I_{CC}$, the second current $I_{CC}$, the first APT/ET voltage $V_{CCA}$, and/or the second APT/ET voltage $V_{CCB}$ to at least one first amplifier circuit 24A and/or at least one second amplifier circuit 24B.

The first amplifier circuit 24A and the second amplifier circuit 24B may be coupled to at least one first antenna 26A and at least one second antenna 26B. Accordingly, the first amplifier circuit 24A can amplify a first radio frequency (RF) signal 28A for transmission via the first antenna 26A. Likewise, the second amplifier circuit 24B can amplify a second RF signal 28B for transmission via the second antenna 26B. The existing apparatus 10 may operate in single-transmit (STX) mode, in which only one of the first amplifier circuit 24A and the second amplifier circuit 24B is operational. The existing apparatus 10 may operate in dual-transmit (DTX) mode, in which both the first amplifier circuit 24A and the second amplifier circuit 24B are operational.

The existing apparatus 10 includes a third charge pump circuit 16C configured to provide the first supply voltage $V_{BATAMPA}$ and the second supply voltage $V_{BATAMPB}$ to the first tracker circuit 18A and the second tracker circuit 18B, respectively. In this regard, the existing apparatus 10 includes at least three charge pump circuits, namely the first charge pump circuit 16A, the second charge pump circuit 16B, and the third charge pump circuit 16C.

Each of the first charge pump circuit 16A, the second charge pump circuit 16B, and the third charge pump circuit 16C can be configured to output a respective voltage at zero volt (0 V), at the battery voltage $V_{BAT}$, or at two-time the battery voltage $V_{BAT}$ ($2 \times V_{BAT}$). Operational principles of the first charge pump circuit 16A, the second charge pump circuit 16B, and the third charge pump circuit 16C are now discussed with reference to FIG. 1B.

FIG. 1B is a schematic diagram of an exemplary charge pump circuit 30, which can be provided in the existing apparatus 10 of FIG. 1A as any one of the first charge pump circuit 16A, the second charge pump circuit 16B, and the third charge pump circuit 16C. Common elements between FIGS. 1A and 1B are shown therein with common element numbers and will not be re-described herein.

The charge pump circuit 30 is configured to receive the battery voltage $V_{BAT}$ at a charge pump input 32 and output a charge pump voltage $V_{CP}$ at a charge pump output 34. The charge pump circuit 30 can be configured to operate in a buck mode to generate the charge pump voltage $V_{CP}$ at 0 V or $V_{BAT}$.

The charge pump circuit 30 can also be configured to operate in a boost mode to generate the charge pump voltage $V_{CP}$ at $2 \times V_{BAT}$. In a non-limiting example, the charge pump voltage $V_{CP}$ can act as one or more of the first APT voltage $V_{CCA}$, the second APT voltage $V_{CCB}$, the first supply voltage $V_{BATAMPA}$, or the second supply voltage $V_{BATAMPB}$ in the existing apparatus 10.

The charge pump circuit 30 may include a power inductor 36 coupled to the charge pump output 34. Accordingly, the power inductor 36 can induce a charge pump current $I_{CP}$ based on the charge pump voltage $V_{CP}$. In a non-limiting example, the charge pump current $I_{CP}$ can act as the first current $I_{CCA}$ or the second current $I_{CCB}$ in the existing apparatus 10.

The charge pump circuit 30 includes a first switch SW1 and a second switch SW2 provided in series between the charge pump input 32 and the charge pump output 34. The charge pump circuit 30 also includes a third switch SW3 and a fourth switch SW4 provided in series between the charge pump input 32 and a ground 38, in parallel to the first switch SW1 and the second switch SW2.

The charge pump circuit 30 also includes a fifth switch SW11 provided between the charge pump input 32 and the charge pump output 34 in parallel to the first switch SW1 and the second switch SW2. The charge pump circuit 30 also includes a sixth switch SW12 provided between the charge pump output 34 and the ground 38. The charge pump circuit 30 also includes a capacitor 40 having a first end 42 coupled between the first switch SW1 and the second switch SW2 and a second end 44 coupled between the third switch SW3 and the fourth switch SW4.

To output the charge pump voltage $V_{CP}$ at 0 V, the sixth switch SW12 is closed, while all other switches remain open. To output the charge pump voltage $V_{CP}$ at $V_{BAT}$, the fifth switch SW11 is closed, while all other switches remain open. As a result, a first battery current $I_{B1}$ flows through the fifth switch SW11.

To output the charge pump voltage $V_{CP}$ at $2 \times V_{BAT}$, the fifth switch SW11 and the sixth switch SW12 are kept open. In a first step, the first switch SW1 and the fourth switch SW4 are closed, while the second switch SW2 and the third switch SW3 remain open. Accordingly, a second battery current $I_{B2}$ flows through the first switch SW1, the capacitor 40, and the fourth switch SW4 to charge the capacitor 40 to the battery voltage $V_{BAT}$. In a second step, the second switch SW2 and the third switch SW3 are closed, while the first switch SW1 and the fourth switch SW4 are opened. Accordingly, a third battery current $I_{B3}$ flows through the third switch SW3, the capacitor 40, and the second switch SW2. Since the capacitor 40 has been charged to the battery voltage $V_{BAT}$ in the first step, the charge pump circuit 30 can thus output the charge pump voltage $V_{CP}$ at $2 \times V_{BAT}$.

When the charge pump circuit 30 is provided in the existing apparatus of FIG. 1A, the first battery current $I_{B1}$, the second battery current $I_{B2}$, and/or the third battery current $I_{B3}$ may be used as important performance indicators of the existing apparatus 10. In one example, by measuring the first battery current $I_{B1}$, the second battery current $I_{B2}$, and/or the third battery current $I_{B3}$ when the existing apparatus 10 undergoes development and/or production tests, it may help to detect and/or debug various design/development/performance issues in the existing apparatus 10. In another example, by measuring the first battery current $I_{B1}$, the second battery current $I_{B2}$, and/or the third battery current $I_{B3}$ when the existing apparatus 10 undergoes field tests, it may help to determine and/or fine-tune various configuration parameters in the existing apparatus 10 for optimal in the field performance. In another example, by measuring the first battery current $I_{B1}$, the second battery current $I_{B2}$, and/or the third battery current $I_{B3}$ when the existing apparatus 10 is in normal operation, it may help to determine battery usage and enable smart power management schemes in the existing apparatus 10.

A conventional approach for measuring the first battery current $I_{B1}$, the second battery current $I_{B2}$, and/or the third battery current $I_{B3}$ may involve adding a number of current measuring resistors in the charge pump circuit 30. For example, a current measuring resistor may be provided in parallel to each of the fifth switch SW11, the first switch SW1, and the third switch SW3 to measure the first battery current $I_{B1}$, the second battery current $I_{B2}$, and the third battery current $I_{B3}$. However, such current measuring resistors can cause a significant loss in the charge pump circuit 30. As a result, the charge pump circuit 30, as well as the existing apparatus 10 employing the charge pump circuit 30, can suffer degraded efficiency and performance. As such, it may be desirable to determine the first battery current $I_{B1}$, the second battery current $I_{B2}$, and/or the third battery current $I_{B3}$ without adding the current measuring resistors.

Figure 2:
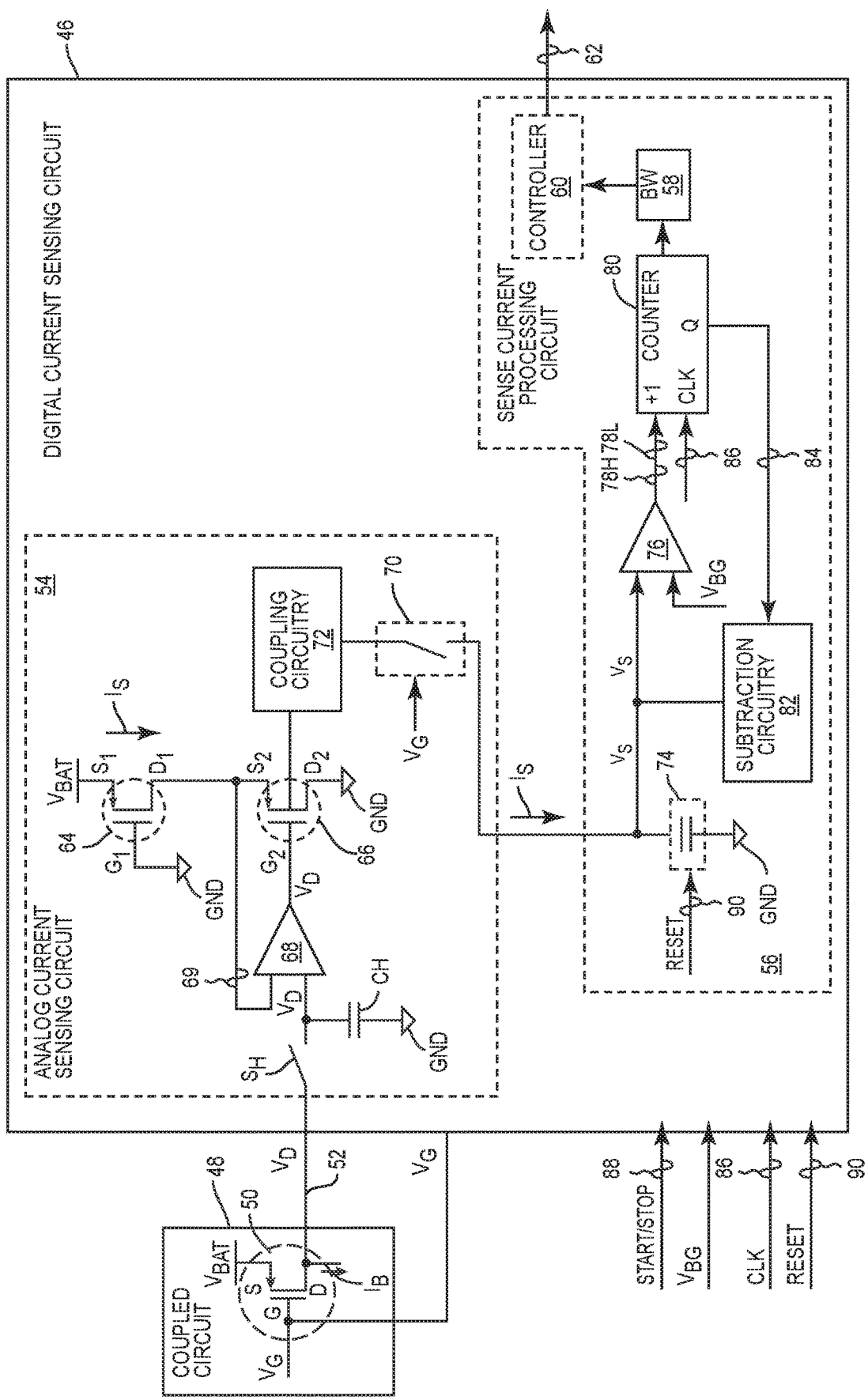
FIG. 2 is a schematic diagram of an exemplary digital current sensing circuit configured according to an embodiment of the present disclosure to estimate a battery current in a coupled circuit.

In this regard, FIG. 2 is a schematic diagram of an exemplary digital current sensing circuit 46 configured according to an embodiment of the present disclosure to estimate a battery current $I_B$ in a coupled circuit 48 without requiring a current measuring resistor(s) in the coupled circuit 48. In examples discussed hereinafter, the coupled circuit 48 represents the fifth switch SW11, the first switch SW1, or the third switch SW3 in the charge pump circuit 30 of FIG. 1B.

In this regard, the battery current $I_B$, which can be estimated by the digital current sensing circuit 46, may correspond to the first battery current $I_{B1}$, the second battery current $I_{B2}$, or the third battery current $I_{B3}$. It should be appreciated that, since the coupled circuit 48 can be other types of circuits, the digital current sensing circuit 46 is not limited to estimating the battery current flowing through a switch.

In a non-limiting example, the fifth switch SW11, the first switch SW1, and the third switch SW3 can each be provided as a p-type field-effect transistor (PFET) 50 consisting of a gate electrode G, a source electrode S, and a drain electrode D. The source electrode S is coupled to the battery voltage $V_{BAT}$. A gate voltage $V_G$ is applied to the gate electrode G. Notably, the PFET 50 is merely discussed herein as a non-limiting example. It should be appreciated that each of the fifth switch SW11, the first switch SW1, and the third switch SW3 can also be provided as an n-type field-effect transistor (NFET).

When the gate voltage $V_G$ is higher than a threshold voltage of the PFET 50, the PFET 50 is turned on, causing the battery current $I_B$ to flow from the source electrode S to the drain electrode D. Accordingly, the PFET 50 presents a voltage $V_D$, which corresponds to the battery current $I_B$, at the drain electrode D.

In contrast, when the gate voltage $V_G$ is below the threshold voltage of the PFET 50, the PFET 50 is turned off. As such, the battery current $I_B$ flowing from the source electrode S to the drain electrode D is substantially close to zero. Accordingly, the voltage $V_D$ at the drain electrode D will be significantly lower as well.

In this regard, the voltage $V_D$ can be quantitatively related to the battery current $I_B$ in the PFET 50, while the gate voltage $V_G$ can indicate presence or absence of the battery current $I_B$ in the PFET 50. As discussed in detail below, the digital current sensing circuit 46 can be configured to estimate the battery current IB in the PFET 50 based on the voltage $V_D$ and the gate voltage $V_G$, thus eliminating the need to provide current measuring resistors in the coupled circuit 48. As a result, it may be possible to improve efficiency and performance of the PFET 50, as well as an apparatus employing the PFET 50 as a switch.

The digital current sensing circuit 46 includes a voltage input 52 configured to receive the voltage $V_D$ from the coupled circuit 48. As mentioned above, the voltage $V_D$ is quantitatively related to the battery current $I_B$ in the coupled circuit 48. The digital current sensing circuit 46 includes an analog current sensing circuit 54 configured to generate an analog sense current $I_S$ based on the voltage $V_D$. In a non-limiting example, the analog sense current $I_S$ can be proportionally related to the battery current $I_B$ in the coupled circuit 48. The digital current sensing circuit 46 also includes a sense current processing circuit 56 that receives the analog sense current $I_S$ from the analog current sensing circuit 54. The sense current processing circuit 56 can be configured to estimate the battery current $I_B$ in the coupled circuit 48 based on the analog sense current $I_S$ and generate a binary word BW that digitally represents the estimated battery current $I_B$. In a non-limiting example, the sense current processing circuit 56 can store the binary word BW in a register 58. The digital current sensing circuit 46 may include a controller 60, which can be a microprocessor, a digital signal processor (DSP), or a field-programmable gate array (FPGA), for example. The controller 60 can be configured to retrieve the binary word BW, for example from the register 58. The controller 60 can be further configured to generate a battery current indication signal 62 based on the binary word BW to indicate an estimation of the battery current $I_B$ in the coupled circuit 48. As a result, it may no longer be necessary to provide a current measuring resistor for measuring the battery current $I_B$ in the coupled circuit 48.

The digital current sensing circuit 46 receives the gate voltage $V_G$ as a battery current indication voltage $V_G$. As discussed above, the gate voltage $V_G$ can serve as an indicator of presence or absence of the battery current $I_B$ in the coupled circuit 48. In a non-limiting example, the battery current indication voltage $V_G$ can be configured to control the analog current sensing circuit 54 to provide the analog sense current $I_S$ to the sense current processing circuit 56 when the battery current $I_B$ is present in the coupled circuit 48.

The analog current sensing circuit 54 may include a holding switch $S_H$ and a holding capacitor $C_H$. The holding switch $S_H$ is coupled to the voltage input 52 and may be opened or closed by the battery current indication voltage $V_G$. When the holding switch $S_H$ is closed, the holding capacitor $C_H$ will be charged to the voltage $V_D$ and holds the voltage $V_D$ until the holding capacitor $C_H$ is discharged.

The analog current sensing circuit 54 includes a sensing transistor 64 and a shunt transistor 66 that are coupled in series. In a non-limiting example, since the coupled circuit 48 includes the PFET 50, the sensing transistor 64 is provided as a PFET and the shunt transistor 66 is provided as an NFET. It should be appreciated that, in case the coupled circuit 48 includes an NFET, the sensing transistor 64 and the shunt transistor 66 may be provided as an NFET and a PFET, respectively.

In a non-limiting example, the sensing transistor 64 includes a drain electrode $D_1$, a source electrode $S_1$ coupled to the battery voltage $V_{BAT}$ and a gate electrode $G_1$ coupled to a ground GND. As such, the sensing transistor 64 may be conductive to allow the analog sense current $I_S$ to flow from the source electrode $S_1$ to the drain electrode $D_1$. The drain electrode $D_1$ of the sensing transistor 64 is coupled to a source electrode $S_2$ of the shunt transistor 66. The shunt transistor 66 includes a drain electrode $D_2$ coupled to the ground GND and a gate electrode $G_2$ coupled to the holding capacitor $C_H$ via an amplifier 68. Accordingly, the shunt transistor 66 receives the voltage $V_D$ at the gate electrode $G_2$. The shunt transistor 66 may be so configured to have a threshold voltage lower than the voltage $V_D$. Accordingly, the shunt transistor 66 can be turned on by the voltage $V_D$ to shunt the analog sense current $I_S$ to the ground GND.

Notably, there may be a voltage drop between the source electrode $S_2$ and the gate electrode $G_2$ of the shunt transistor 66. In this regard, the amplifier 68 is configured to amplify the voltage $V_D$ to compensate for the voltage drop between the source electrode $S_2$ and the gate electrode $G_2$ of the shunt transistor 66. As such, a voltage at the drain electrode $D_1$ of the sensing transistor 64 can be substantially similar to the voltage $V_D$ in the PFET 50. As a result, the voltage between the source electrode $S_1$ and the drain electrode $D_1$ of the sensing transistor 64 can be substantially similar to the voltage between the source electrode S and the drain electrode D of the PFET 50 in the coupled circuit 48. Accordingly, the sensing transistor 64 may generate the analog sensing current $I_S$ that is proportional to the battery current $I_B$ in the coupled circuit 48. The amplifier 68 may receive a voltage feedback 69 indicative of voltage at the drain electrode $D_1$ of the sensing transistor 64. Accordingly, the amplifier 68 may amplify the voltage $V_D$ based on the voltage feedback 69. In a non-limiting example, the sensing transistor 64 can be significantly smaller than the PFET 50 in the coupled circuit 48. As a result, the analog sensing current $I_S$ can be smaller than the battery current $I_B$ in the coupled circuit 48.

The analog current sensing circuit 54 can further include switch circuitry 70 and coupling circuitry 72. The coupling circuitry 72 is configured to couple the analog sense current $I_S$ to the switch circuitry 70. The battery current indication voltage $V_G$ may cause the switch circuitry 70 to provide the analog sense current $I_S$ to the sense current processing circuit 56.

The sense current processing circuit 56 includes an integrating capacitor 74 configured to generate a sensing voltage Vs based on the analog sensing current $I_S$. The sense current processing circuit 56 includes a comparator 76 configured to compare the sensing voltage Vs against a predefined bandgap voltage $V_{BG}$ (also referred to as a "threshold voltage"). The comparator 76 is configured to output a high trigger signal 78H (e.g., a non-zero voltage) when the sensing voltage Vs is higher than or equal to the predefined bandgap voltage $V_{BG}$. The comparator 76 is further configured to output a low trigger signal 78L (e.g., a zero voltage) when the sensing voltage Vs is lower than the predefined bandgap voltage $V_{BG}$.

The sense current processing circuit 56 includes a digital counter 80 coupled to the comparator 76. The digital counter 80 is configured to count each occurrence of the high trigger signal 78H in the binary word BW. The sense current processing circuit 56 may also include subtraction circuitry 82. In a non-limiting example, the digital counter 80 can be configured to generate a subtraction enable signal 84 concurrent to or after counting each occurrence of the high trigger signal 78H. The subtraction circuitry 82 can be configured to reduce the sensing voltage Vs to below the bandgap voltage $V_{BG}$, thus causing the comparator 76 to output the low trigger signal 78L.

In a non-limiting example, the register 58 is an 8-bit register that can store the binary word BW ranging from binary value "00000000" (representing decimal value "0") to binary value "11111111" (representing decimal value "255"). In this regard, each time the comparator 76 outputs the high trigger signal 78H, the digital counter 80 causes the register 58 to increase by binary value "00000001" at, for example, the least-significant big (LSB). The digital counter 80 may be configured to operate based on a clock signal 86. In a non-limiting example, the comparator 76 and the digital counter 80 can take up to 32 clock cycles to generate the high trigger signal 78H and increase the register 58. Accordingly, it may take up to 256 clock cycles to update the register 58. In this regard, the controller 60 may be configured to retrieve the binary word BW from the register 58 to generate the battery current indication signal 62 after a defined temporal duration $T_D$ of, for example, 256 clock cycles.

The bandgap voltage $V_{BG}$ can be so determined to cause the comparator 76 to output the high trigger signal 78H when the sensing voltage Vs corresponds to a predetermined current unit. For example, the bandgap voltage $V_{BG}$ can be so determined such that the sensing voltage Vs causing the comparator 76 to output the high trigger signal 78H corresponds to the predetermined current unit of 50 milliamps (50 mA). Thus, each time the digital counter 80 increases the binary word DW, it represents a 50 mA increase in the battery current $I_B$. As such, after the defined temporal duration $T_D$ (e.g., 256 clock cycles), the controller 60 may simply multiply the binary word BW with the predetermined current unit (e.g., 50 mA) to generate the battery current indication signal 62 indicative of the estimation of the battery current $I_B$ in the coupled circuit 48. For example, if the binary word BW is "00000110" (representing decimal value "6") at the end of the defined temporal duration $T_D$, then the battery current $I_B$ can be estimated as equaling 6×50 mA=300 mA.

The digital current sensing circuit 46 may be configured to receive a start/stop signal 88 and a reset signal 90. The start/stop signal 88 may be used to configure the digital current sensing to start or stop sensing the battery current $I_B$. In a non-limiting example, the start/stop signal 88 can be asserted to cause the digital current sensing circuit 46 to start sensing the battery current $I_B$ and de-asserted to cause the digital current sensing circuit 46 to stop sensing the battery current $I_B$. The reset signal 90 may be used to reset the integrating capacitor 74 prior to starting to sense the battery current $I_B$.

Figure 3:
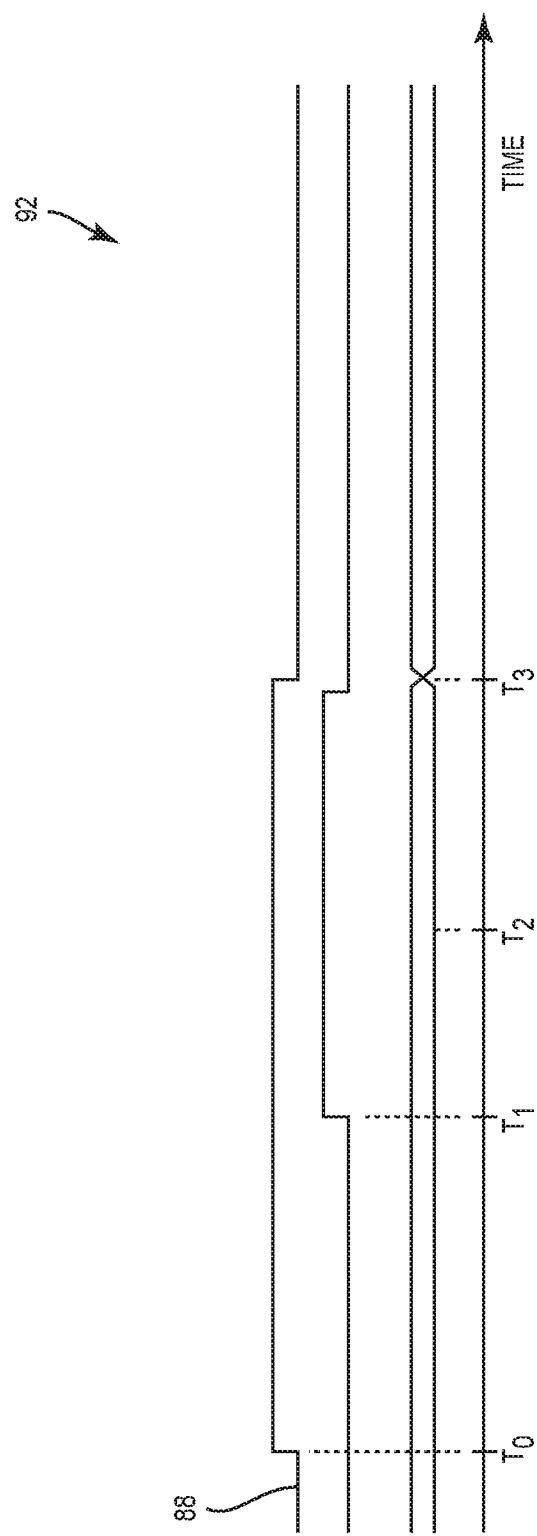
FIG. 3 is a graphic diagram providing an exemplary illustration of a timing sequence related to the digital current sensing circuit of FIG. 2.

FIG. 3 is a graphic diagram providing an exemplary illustration of a timing sequence 92 related to the digital current sensing circuit 46 of FIG. 2. Common elements between FIGS. 2 and 3 are shown therein with common element numbers and will not be re-described herein.

At time $T_0$, the start/stop signal 88 is asserted to cause the digital current sensing circuit 46 to start sensing the battery current $I_B$ (not shown) in the coupled circuit 48 (not shown). The reset signal 90 (not shown) may be provided to the digital current sensing circuit 46 concurrent to or slightly after the assertion of the start/stop signal 88. At time $T_1$, the digital current sensing circuit 46 is activated by the start/stop signal 88 and starts to ramp up. At time $T_2$, the digital current sensing circuit 46 starts sensing the battery current $I_B$ based on operation principles discussed above. At time $T_3$, the digital current sensing circuit 46 completes generating the binary word BW in the register 58 (not shown). In this regard, the duration between $T_2$ and $T_3$ corresponds to the predefined temporal duration $T_D$. Subsequently, the controller 60 (not shown) is ready to retrieve the binary word BW from the register 58 to generate the battery current indication signal 62 (not shown).

As previously discussed in FIG. 1B, the first battery current $I_{B1}$, the second battery current $I_{B2}$, and/or the third battery current $I_{B3}$ may be important performance indicators for determining efficiency and performance of an apparatus employing the charge pump circuit 30 of FIG. 1B. As such, it may be desirable to adapt the digital current sensing circuit 46 of FIG. 2 to concurrently estimate a number of battery currents associated with a number of switches in the charge pump circuit 30. In this regard, FIG. 4 is a schematic diagram of an exemplary digital current sensing circuit 46A configured according to an embodiment of the present disclosure to estimate a number of battery currents $I_{B1}$, $I_{B2}$, and $I_{B3}$ in a first coupled circuit 48A, a second coupled circuit 48B, and a third coupled circuit 48C. Common elements between FIGS. 2 and 4 are shown therein with common element numbers and will not be re-described herein.

In a non-limiting example, the first coupled circuit 48A, the second coupled circuit 48B, and the third coupled circuit 48C correspond respectively to the fifth switch SW11, the first switch SW1, and the third switch SW3. Accordingly, the digital current sensing circuit 46A is configured to concurrently or selectively estimate the first battery current $I_{B1}$, the second battery current $I_{B2}$, and/or the third battery current $I_{B3}$ flowing through the fifth switch SW11, the first switch SW1, and/or the third switch SW3 when the charge pump circuit 30 operates in the buck mode or the boost mode.

The digital current sensing circuit 46A includes a first analog current sensing circuit 54A, a second analog current sensing circuit 54B, and a third analog current sensing circuit 54C. Each of the first analog current sensing circuit 54A, the second analog current sensing circuit 54B, and the third analog current sensing circuit 54C is identical to the analog current sensing circuit 54 in the digital current sensing circuit 46 of FIG. 2. In this regard, the configuration and operation principle of the analog current sensing circuit 54, as discussed in FIG. 2, are applicable to the first analog current sensing circuit 54A, the second analog current sensing circuit 54B, and the third analog current sensing circuit 54C.

In a non-limiting example, the first coupled circuit 48A, the second coupled circuit 48B, and the third coupled circuit 48C include a first PFET 50A, a second PFET 50B, and a third PFET 50C, respectively. In this regard, the first analog current sensing circuit 54A receives a first voltage $V_{D1}$ and a first battery current indication voltage $V_{G1}$ from the first PFET 50A. The second analog current sensing circuit 54B receives a second voltage $V_{D2}$ and a second battery current indication voltage $V_{G2}$ from the second PFET 50B. The third analog current sensing circuit 54C receives a third voltage $V_{D3}$ and a third battery current indication voltage $V_{G3}$ from the third PFET 50C. Each of the first voltage $V_{D1}$, the second voltage $V_{D2}$, and the third voltage $V_{D3}$ is equivalent to the voltage $V_D$ as discussed in FIG. 2. Likewise, each of the first battery current indication voltage $V_{G1}$, the second battery current indication voltage $V_{G2}$, and the third battery current indication voltage $V_{G3}$ is equivalent to the battery current indication voltage $V_G$ as discussed in FIG. 2.

Like the analog current sensing circuit 54 in FIG. 2, the first analog current sensing circuit 54A is configured to generate a first analog sense current $I_S$ proportional to the first battery current $I_{B1}$ based on the first voltage $V_{D1}$. Likewise, the second analog current sensing circuit 54B is configured to generate a second analog sense current $I_{S2}$ proportional to the second battery current $I_{B2}$ based on the second voltage $V_{D2}$ and the third analog current sensing circuit 54C is configured to generate a third analog sense current $I_{S3}$ proportional to the third battery current $I_{B3}$ based on the third voltage $V_{D3}$.

The sense current processing circuit 56 is configured to receive the first analog sense current $I_{S1}$, the second analog sense current $I_{S2}$, and/or the third analog sense current $I_{S3}$, either concurrently or selectively. Accordingly, the sense current processing circuit 56 is configured to estimate a sum of the first battery current $I_{B1}$, the second battery current $I_{B2}$, and/or the third battery current $I_{B3}$ in the first PFET 50A, the second PFET 50B, and/or the third PFET 50C based on a sum of the first analog sense current $I_{S1}$, the second analog sense current $I_{S2}$, and/or the third analog sense current $I_{S3}$. More specifically, the integrating capacitor 74 is configured to generate the sense voltage VS based on the sum of the first analog sense current $I_{S1}$, the second analog sense current $I_{S2}$, and/or the third analog sense current $I_{S3}$. As a result, the battery current indication signal 62 indicates an estimation of the sum of the first battery current $I_{B1}$, the second battery current $I_{B2}$, and/or the third battery current $I_{B3}$.

Although the first analog current sensing circuit 54A, the second analog current sensing circuit 54B, and the third analog current sensing circuit 54C are all coupled to the sense current processing circuit 56, it should be appreciated that the digital current sensing circuit 46 may operate based on different configurations. For example, it may be possible to couple each of the first analog current sensing circuit 54A, the second analog current sensing circuit 54B, and the third analog current sensing circuit 54C to a respective sense current processing circuit. In addition, it may also be possible to include additional analog current sensing circuits and/or additional sensing current processing circuits in the digital current sensing circuit 46A without altering operational principles of the digital current sensing circuit 46A.

As previously discussed in FIG. 1A, the existing apparatus 10 can include the first charge pump circuit 16A, the second charge pump circuit 16B, and the third charge pump circuit 16C. In this regard, it may be desirable to estimate a total battery current in the first charge pump circuit 16A, the second charge pump circuit 16B, and the third charge pump circuit 16C. In this regard, FIG. 5 is a schematic diagram of an exemplary apparatus 94 adapted from the existing apparatus 10 of FIG. 1A to estimate a total battery current in the first charge pump circuit 16A, the second charge pump circuit 16B, and the third charge pump circuit 16C by adding a number of the digital current sensing circuits, such as the digital current sensing circuit 46A of FIG. 4, to the existing apparatus 10. Common elements between FIGS. 1A, 4, and 5 are shown therein with common element numbers and will not be re-described herein.

The apparatus 94 includes a first digital current sensing circuit 96A, a second digital current sensing circuit 96B, and a third digital current sensing circuit 96C coupled to the first charge pump circuit 16A, the second charge pump circuit 16B, and the third charge pump circuit 16C, respectively. Each of the first digital current sensing circuit 96A, the second digital current sensing circuit 96B, and the third digital current sensing circuit 96C is identical to the digital current sensing circuit 46A of FIG. 4. Accordingly, the first digital current sensing circuit 96A generates a first battery current indication signal 98A indicative of a total battery current in the first charge pump circuit 16A, the second digital current sensing circuit 96B generates a second battery current indication signal 98B indicative of a total battery current in the second charge pump circuit 16B, and the third digital current sensing circuit 96C generates a third battery current indication signal 98C indicative of a total battery current in the third charge pump circuit 16C.

The apparatus 94 may include a control circuit 100. According to previous discussions in FIGS. 2 and 4, each of the first digital current sensing circuit 96A, the second digital current sensing circuit 96B, and the third digital current sensing circuit 96C may include the controller 60. As such, it may be possible to configure the controller 60 in one of the first digital current sensing circuit 96A, the second digital current sensing circuit 96B, and the third digital current sensing circuit 96C to function as the control circuit 100. Alternatively, it may also be possible to provide the control circuit 100 as an independent microprocessor.

The control circuit 100 may be configured to receive the first battery current indication signal 98A, the second battery current indication signal 98B, and the third battery current indication signal 98C. Accordingly, the control circuit 100 may generate a total battery current indication signal 102 to indicate the total battery current in the first charge pump circuit 16A, the second charge pump circuit 16B, and the third charge pump circuit 16C.

As previously discussed in FIG. 2, the sense current processing circuit 56 includes the register 58 to store the binary word BW and the controller 60 to retrieve the binary word BW from the register 58 to generate the battery current indication signal 62. As such, each of the first digital current sensing circuit 96A, the second digital current sensing circuit 96B, and the third digital current sensing circuit 96C will also have the sense current processing circuit 56 that includes the register 58.

In an alternative embodiment, it may be possible to move the register 58 from each of the first digital current sensing circuit 96A, the second digital current sensing circuit 96B, and the third digital current sensing circuit 96C into the control circuit 100. In this regard, the control circuit 100 can include three registers for storing three different binary words for the first digital current sensing circuit 96A, the second digital current sensing circuit 96B, and the third digital current sensing circuit 96C, respectively. Accordingly, the control circuit 100 may retrieve the three different binary words from the three registers to generate the total battery current indication signal 102.

In an alternative embodiment, it may be possible to share two registers among the first digital current sensing circuit 96A, the second digital current sensing circuit 96B, and the third digital current sensing circuit 96C, thus eliminating one register to save cost and reduce footprint of the apparatus 94. In a non-limiting example, the two registers (hereinafter referred to as "REG1" and "REG2") can be shared among the first digital current sensing circuit 96A, the second digital current sensing circuit 96B, and the third digital current sensing circuit 96C based different operation modes of the apparatus 94. Accordingly, the control circuit 100 may generate the total battery current indication signal 102 indicative of the total battery current in the first charge pump circuit 16A, the second charge pump circuit 16B, and the third charge pump circuit 16C based on the equation (Eq. 1) below.

$$\text{Total Battery Current} = (REG1 + REG2) \times \text{Predetermined Current Unit} \quad \text{(Eq. 1)}$$

In a first non-limiting example, the apparatus 94 operates in an APT STX mode based on the first voltage circuit 12A. In this regard, the first charge pump circuit 16A is turned on to generate the first APT voltage $V_{CCA}$, while the second charge pump circuit 16B and the third charge pump circuit 16C are turned off. Accordingly, the sense current processing circuit 56 in the first digital current sensing circuit 96A may store a first binary word representing an estimation of the first battery current $I_{B1}$ in REG1. Meanwhile, REG2 is unused and set to zero.

In a second non-limiting example, the apparatus 94 operates in an APT STX mode based on the second voltage circuit 12B. In this regard, the second charge pump circuit 16B is turned on to generate the second APT voltage $V_{CCB}$, while the first charge pump circuit 16A and the third charge pump circuit 16C are turned off. Accordingly, the sense current processing circuit 56 in the second digital current sensing circuit 96B may store a second binary word representing an estimation of the second battery current $I_{B2}$ in REG2. Meanwhile, REG1 is unused and set to zero.

In a third non-limiting example, the apparatus 94 operates in an APT DTX mode based on the first voltage circuit 12A and the second voltage circuit 12B. In this regard, the first charge pump circuit 16A and the second charge pump circuit 16B are turned on to generate the first APT voltage $V_{CCA}$ and the second APT voltage $V_{CCB}$, respectively, while the third charge pump circuit 16C is turned off. Accordingly, the sense current processing circuit 56 in the first digital current sensing circuit 96A may store a first binary word representing an estimation of the first battery current $I_{B1}$ in REG1. The sense current processing circuit 56 in the second digital current sensing circuit 96B may store a second binary word representing an estimation of the second battery current $I_{B2}$ in REG2.

In a fourth non-limiting example, the apparatus 94 operates in an ET STX mode based on the first voltage circuit 12A. In this regard, the first charge pump circuit 16A is turned on to generate the first current $I_{CCA}$, the first tracker circuit 18A is turned on to generate the first ET voltage $V_{CCA}$, and the third charge pump circuit 16C is turned on to provide the first supply voltage $V_{BATAMPA}$ to the first tracker circuit 18A. In the meantime, the second charge pump circuit 16B is turned off. Accordingly, the sense current processing circuit 56 in the first digital current sensing circuit 96A and the third digital current sensing circuit 96C may store a first binary word representing an estimation of the first battery current $I_{B1}$ and a third binary word representing an estimation of the third battery current $I_{B3}$ in REG1. Meanwhile, REG2 is unused and set to zero.

In a fifth non-limiting example, the apparatus 94 operates in an ET STX mode based on the second voltage circuit 12B. In this regard, the second charge pump circuit 16B is turned on to generate the second current $I_{CCB}$, the second tracker circuit 18B is turned on to generate the second ET voltage $V_{CCB}$, and the third charge pump circuit 16C is turned on to provide the second supply voltage $V_{BATAMPB}$ to the second tracker circuit 18B. In the meantime, the first charge pump circuit 16A is turned off. Accordingly, the sense current processing circuit 56 in the second digital current sensing circuit 96B and the third digital current sensing circuit 96C may store a second binary word representing an estimation of the second battery current $I_{Bw}$ and a third binary word representing an estimation of the third battery current $I_{B3}$ in REG2. Meanwhile, REG1 is unused and set to zero.

In a sixth non-limiting example, the apparatus 94 operates in an ET DTX mode based on the first voltage circuit 12A and the second voltage circuit 12B. In this regard, the first charge pump circuit 16A is turned on to generate the first current $I_{CCA}$, and the first tracker circuit 18A is turned on to generate the first ET voltage $V_{CCA}$. Concurrently, the second charge pump circuit 16B is turned on to generate the second current $I_{CCB}$, and the second tracker circuit 18B is turned on to generate the second ET voltage $V_{CCB}$. The third charge pump circuit 16C is also turned on to provide the first supply voltage $V_{BATAMPA}$ and the second supply voltage $V_{BATAMPB}$ to the first tracker circuit 18A and the second tracker circuit 18B. Accordingly, the sense current processing circuit 56 in the first digital current sensing circuit 96A and the second digital current sensing circuit 96B may store a first binary word representing an estimation of the first battery current $I_{B1}$ and a second binary word representing an estimation of the second battery current $I_{B2}$ in REG1 and REG2, respectively. The sense current processing circuit 56 in the third digital current sensing circuit 96C is configured to generate a third binary word representing an estimation of the third battery current $I_{B3}$. The sense current processing circuit 56 in the third digital current sensing circuit 96C may be configured to store the third binary word with the first binary word in REG1, or to store the third binary word with the second binary word in REG2, or to split the third binary word between REG1 and REG2, depending on the operation mode.

Those skilled in the art will recognize improvements and modifications to the preferred embodiments of the present disclosure. All such improvements and modifications are considered within the scope of the concepts disclosed herein and the claims that follow.

What is claimed is:

1. A digital current sensing circuit comprising:
   a voltage input configured to receive a voltage corresponding to a battery current in a coupled circuit;
   an analog current sensing circuit configured to:
      receive a battery current indication voltage that is applied to the coupled circuit and indicates whether the battery current is present in the coupled circuit, wherein the battery current indication voltage is different from the voltage corresponding to the battery current; and
      generate an analog sense current proportional to the battery current based on the voltage in response to the battery current indication voltage indicating that the battery current is present in the coupled circuit; and
   a sense current processing circuit comprising:
      an integrating capacitor configured to generate a sensing voltage based on the analog sense current;
      a comparator configured to:
         output a high trigger signal in response to the sensing voltage being higher than or equal to a threshold voltage; and
         output a low trigger signal in response to the sensing voltage being lower than the threshold voltage; and
      a digital counter configured to count each occurrence of the high trigger signal to generate a binary word representing the estimated battery current in the coupled circuit and store the binary word such that the stored binary word can be retrieved to thereby generate a battery current indication signal indicative of an estimation of the battery current in the coupled circuit based on the retrieved binary word.

2. The digital current sensing circuit of claim 1 wherein the analog current sensing circuit is further configured to:
   receive the battery current indication voltage indicating that the battery current is absent in the coupled circuit; and
   not generate the analog sense current in response to receiving the battery current indication voltage indicating that the battery current is absent in the coupled circuit.

3. The digital current sensing circuit of claim 1 wherein the analog current sensing circuit comprises:
   a sensing transistor and a shunt transistor coupled in series, wherein:
      the sensing transistor is configured to induce the analog sense current based on the voltage received via the voltage input; and
      the shunt transistor is configured to shunt the analog sense current to a ground;
   switch circuitry configured to provide the analog sense current to the sense current processing circuit in response to receiving the battery current indication voltage; and
   coupling circuitry configured to couple the analog sense current to the switch circuitry.

4. The digital current sensing circuit of claim 1 wherein the sense current processing circuit further comprises subtraction circuitry configured to reduce the sensing voltage to below the threshold voltage after counting each occurrence of the high trigger signal in the binary word.

5. The digital current sensing circuit of claim 4 wherein the sense current processing circuit further comprises a controller configured to retrieve the binary word and generate the battery current indication signal based on the binary word.

6. The digital current sensing circuit of claim 1 further comprising a second analog current sensing circuit configured to:
   receive a second voltage corresponding to a second battery current in the coupled circuit; and
   generate a second analog sense current based on the second voltage, wherein the second analog sense current is proportional to the second battery current in the coupled circuit;

wherein the sense current processing circuit is further configured to:
estimate the battery current in the coupled circuit based on the analog sense current and the second analog sense current;
generate the binary word representing the estimated battery current in the coupled circuit; and
generate the battery current indication signal indicative of an estimation of the battery current in the coupled circuit based on the binary word.

7. The digital current sensing circuit of claim 6 further comprising a third analog current sensing circuit configured to:
receive a third voltage corresponding to a third battery current in the coupled circuit; and
generate a third analog sense current based on the third voltage, wherein the third analog sense current is proportional to the third battery current in the coupled circuit;
wherein the sense current processing circuit is further configured to:
estimate the battery current in the coupled circuit based on the analog sense current, the second analog sense current, and the third analog sense current;
generate the binary word representing the estimated battery current in the coupled circuit; and
generate the battery current indication signal indicative of an estimation of the battery current in the coupled circuit based on the binary word.

8. The digital current sensing circuit of claim 7 wherein:
the integrating capacitor is further configured to generate the sensing voltage based on a sum of the analog sense current, the second analog sense current, and the third analog sense current;
the comparator is further configured to:
output the high trigger signal in response to the sensing voltage being higher than or equal to the threshold voltage; and
output the low trigger signal in response to the sensing voltage being lower than the threshold voltage; and
the digital counter is further configured to count each occurrence of the high trigger signal in the binary word;
wherein the sense processing circuit further comprises subtraction circuitry configured to reduce the sensing voltage to below the threshold voltage after counting each occurrence of the high trigger signal in the binary word.

9. An apparatus comprising:
a first voltage circuit coupled to at least one amplifier circuit and comprising:
a first tracker circuit configured to generate a first modulated voltage at a first output node based on a first supply voltage;
a first charge pump circuit configured to generate a first current at the first output node; and
a first digital current sensing circuit comprising:
a voltage input configured to receive a voltage corresponding to a battery current in the first charge pump circuit;
an analog current sensing circuit configured to:
receive a battery current indication voltage that indicates whether the battery current is present in a coupled circuit, wherein the battery current indication voltage is different from the voltage corresponding to the battery current; and
generate an analog sense current proportional to the battery current based on the voltage in response to the battery current indication voltage indicating that the battery current is present in the coupled circuit; and
a sense current processing circuit comprising:
an integrating capacitor configured to generate a sensing voltage based on the analog sense current;
a comparator configured to:
output a high trigger signal in response to the sensing voltage being higher than or equal to a threshold voltage; and
output a low trigger signal in response to the sensing voltage being lower than the threshold voltage; and
a digital counter configured to count each occurrence of the high trigger signal to generate a binary word representing the estimated battery current in the first charge pump circuit and store the binary word
such that the stored binary word can be retrieved to thereby generate a battery current indication signal indicative of an estimation of the battery current in the first charge pump circuit based on the retrieved binary word;
a second voltage circuit coupled to the at least one amplifier circuit and comprising:
a second tracker circuit configured to generate a second modulated voltage at a second output node based on a second supply voltage; and
a second charge pump circuit configured to generate a second current at the second output node; and
a third charge pump circuit configured to provide the first supply voltage and the second supply voltage to the first tracker circuit and the second tracker circuit, respectively.

10. The apparatus of claim 9 wherein the analog current sensing circuit is further configured to:
receive the battery current indication voltage indicating that the battery current is absent in the coupled circuit; and
not generate the analog sense current in response to receiving the battery current indication voltage indicating that the battery current is absent in the coupled circuit.

11. The apparatus of claim 9 wherein the analog current sensing circuit comprises:
a sensing transistor and a shunt transistor coupled in series, wherein:
the sensing transistor is configured to induce the analog sense current based on the voltage received via the voltage input; and
the shunt transistor is configured to shunt the analog sense current to a ground;
switch circuitry configured to provide the analog sense current to the sense current processing circuit in response to receiving the battery current indication voltage; and
coupling circuitry configured to couple the analog sense current to the switch circuitry.

12. The apparatus of claim 9 wherein the sense current processing circuit further comprises subtraction circuitry configured to reduce the sensing voltage to below the threshold voltage after counting each occurrence of the high trigger signal in the binary word.

13. The apparatus of claim 9 wherein the sense current processing circuit further comprises a controller configured to retrieve the binary word and generate the battery current indication signal based on the binary word.

14. The apparatus of claim 9 wherein the first digital current sensing circuit further comprises a second analog current sensing circuit configured to:
   receive a second voltage corresponding to a second battery current in the first charge pump circuit; and
   generate a second analog sense current based on the second voltage, wherein the second analog sense current is proportional to the second battery current in the first charge pump circuit;
   wherein the sense current processing circuit is further configured to:
      estimate the battery current in the first charge pump circuit based on the analog sense current and the second analog sense current;
      generate the binary word representing the estimated battery current in the first charge pump circuit; and
      generate the battery current indication signal indicative of an estimation of the battery current in the first charge pump circuit based on the binary word.

15. The apparatus of claim 14 wherein the first digital current sensing circuit further comprises a third analog current sensing circuit configured to:
   receive a third voltage corresponding to a third battery current in the first charge pump circuit; and
   generate a third analog sense current based on the third voltage, wherein the third analog sense current is proportional to the third battery current in the first charge pump circuit;
   wherein the sense current processing circuit is further configured to:
      estimate the battery current in the first charge pump circuit based on the analog sense current, the second analog sense current, and the third analog sense current;
      generate the binary word representing the estimated battery current in the first charge pump circuit; and
      generate the battery current indication signal indicative of an estimation of the battery current in the first charge pump circuit based on the binary word.

16. The apparatus of claim 15 wherein:
   the integrating capacitor is further configured to generate the sensing voltage based on a sum of the analog sense current, the second analog sense current, and the third analog sense current;
   the comparator is further configured to:
      output the high trigger signal in response to the sensing voltage being higher than or equal to the threshold voltage; and
      output the low trigger signal in response to the sensing voltage being lower than the threshold voltage; and
   the digital counter is further configured to count each occurrence of the high trigger signal to generate the binary word;
   wherein the sense current processing circuit further comprises subtraction circuitry configured to reduce the sensing voltage to below the threshold voltage after counting each occurrence of the high trigger signal in the binary word.

17. The apparatus of claim 9 wherein the second voltage circuit further comprises a second digital current sensing circuit configured to generate a second battery current indication signal indicative of an estimation of a second battery current in the second charge pump circuit.

18. The apparatus of claim 9 wherein the third charge pump circuit further comprises a third digital current sensing circuit configured to generate a third battery current indication signal indicative of an estimation of a third battery current in the third charge pump circuit.

* * * * *